(12) United States Patent
Yang et al.

(10) Patent No.: US 9,190,564 B2
(45) Date of Patent: Nov. 17, 2015

(54) ARRAY SUBSTRATE AND METHOD FOR FABRICATING THE SAME

(71) Applicant: BOE Technology Group Co., Ltd., Beijing (CN)

(72) Inventors: Jing Yang, Beijing (CN); Jianshe Xue, Beijing (CN); Xiang Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 13/995,122

(22) PCT Filed: Nov. 7, 2012

(86) PCT No.: PCT/CN2012/084187
§ 371 (c)(1),
(2) Date: Jun. 17, 2013

(87) PCT Pub. No.: WO2013/135062
PCT Pub. Date: Sep. 19, 2013

(65) Prior Publication Data
US 2014/0070239 A1 Mar. 13, 2014

(30) Foreign Application Priority Data
Mar. 13, 2012 (CN) .......................... 2012 1 0065761

(51) Int. Cl.
*H01L 21/00* (2006.01)
*H01L 33/08* (2010.01)
*G02F 1/1362* (2006.01)
*H01L 27/12* (2006.01)

(52) U.S. Cl.
CPC .............. *H01L 33/08* (2013.01); *G02F 1/1362* (2013.01); *H01L 27/1288* (2013.01)

(58) Field of Classification Search
None
See application file for complete search history.

(56) References Cited

U.S. PATENT DOCUMENTS

| 7,732,814 B2* | 6/2010 | Lee et al. ........................ 257/59 |
| 2005/0142704 A1* | 6/2005 | Oh et al. ....................... 438/158 |
| 2008/0012017 A1 | 1/2008 | Jung |

(Continued)

FOREIGN PATENT DOCUMENTS

| CN | 100429765 C | 10/2008 |
| CN | 100587571 C | 2/2010 |

(Continued)

OTHER PUBLICATIONS

Third Office Action issued by State Intellectual Property Office of the People's Republic of China for Chinese Patent Application No. 2012100657616 dated Jun. 30, 2014, 4pgs.

(Continued)

*Primary Examiner* — Kyoung Lee

(57) ABSTRACT

An array substrate and a method for fabricating the same are disclosed. The method for fabricating the array substrate comprises: forming a pattern of a gate electrode (2) and a common electrode (3) on a substrate (1); forming a pattern of a gate insulating layer (4), an active layer (5), a source/drain electrode layer (6) and a first passivation layer (7), wherein the first passivation layer (7) has a via hole and a thin film transistor (TFT) channel window, and the TFT channel window is located above the gate electrode (2); forming a TFT channel and a pixel electrode (9) with slits, wherein the pixel electrode (9) is connected to one of the source/drain electrode (6) through the via hole. The method is not only simple and stable but also improves the TFT quality.

8 Claims, 3 Drawing Sheets

(56) References Cited

U.S. PATENT DOCUMENTS

| | | | |
|---|---|---|---|
| 2008/0024416 A1 | 1/2008 | Onogi et al. | |
| 2009/0051842 A1* | 2/2009 | Kim et al. | 349/40 |
| 2009/0135322 A1* | 5/2009 | Kim et al. | 349/37 |
| 2009/0174852 A1* | 7/2009 | Watanabe et al. | 349/138 |
| 2011/0285931 A1 | 11/2011 | Kimura et al. | |
| 2012/0112346 A1* | 5/2012 | Ning et al. | 257/746 |
| 2012/0184060 A1 | 7/2012 | Song et al. | |

FOREIGN PATENT DOCUMENTS

| | | |
|---|---|---|
| CN | 101452163 B | 8/2010 |
| CN | 102148195 A | 8/2011 |
| CN | 102651342 A | 8/2012 |

OTHER PUBLICATIONS

English translation of Third Office Action issued by State Intellectual Property Office of the People's Republic of China for Chinese Patent Application No. 2012100657616 dated Jun. 30, 2014, 3pgs.

English translation of Chinese Patent CN101452163 B—(listed above), 24 pages.

English translation of Chinese Patent CN102148195 A (listed above), 50 pages.

English translation of Chinese Patent CN100587571 C (listed above), 28 pages.

English translation of Chinese Patent CN100429765 C (listed above), 40 pages.

English translation of Chinese patent CN102651342 A (listed above), 25 pages.

Chinese Language First Office Action issued by SIPO Aug. 5, 2013 for patent application 201210065761.6, 8 pages.

Chinese Language Second Office Action issued by SIPO Jan. 24, 2014 for patent application 201210065761.6, 5 pages.

English translation of First Office Action (listed above) issued by SIPO Aug. 5, 2013 for patent application 201210065761.6, 7 pages.

English translation of Second Office Action (listed above) issued by SIPO Jan. 24, 2014 for patent application 201210065761.6, 5 pages.

International Search Report issued Jul. 11, 2012 by the International Searching Authority for PCT/CN2012/084187, 15 pages.

International Search Report (English language), for PCT Application No. PCT/CN2012/084187, dated Feb. 14, 2013; 3 pages.

International Preliminary Report on Patentability, for PCT Application No. PCT/CN2012/084187, dated Sep. 16, 2014; 12 pages.

\* cited by examiner

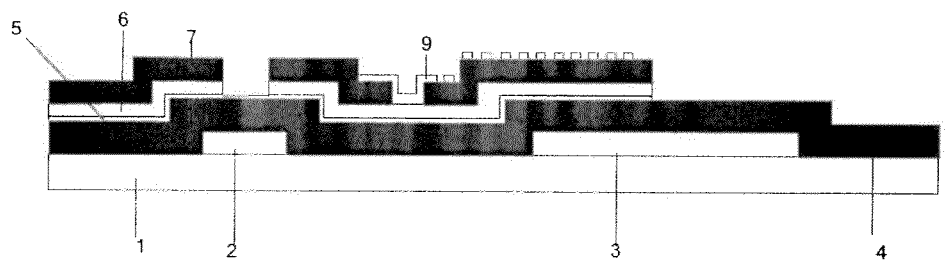
Fig. 1
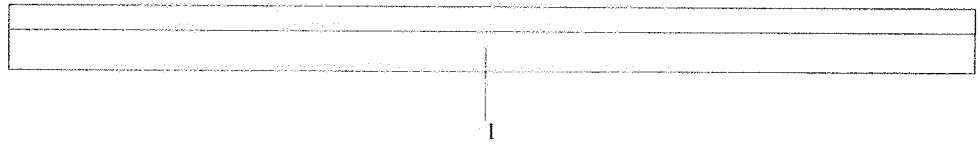
Fig. 2.1
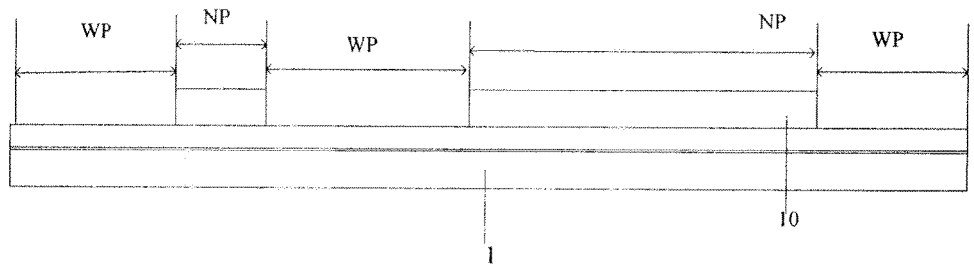
Fig. 2.2
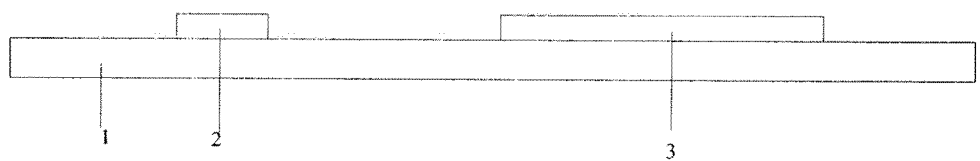
Fig. 2.3
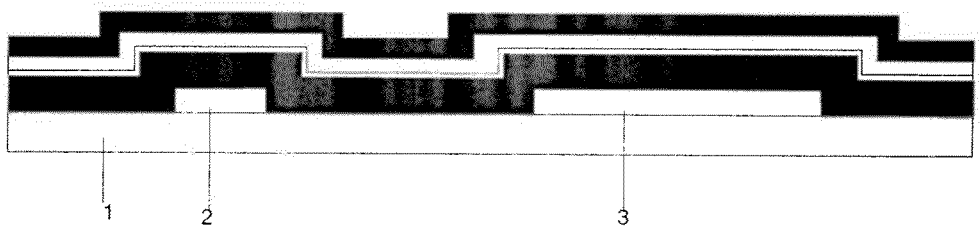
Fig. 3.1

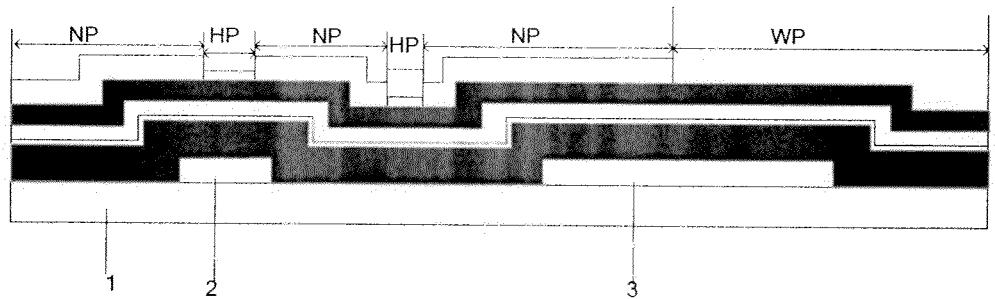
Fig. 3.2
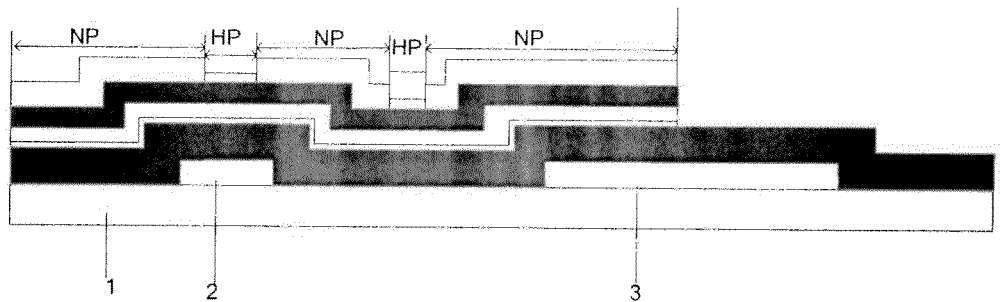
Fig. 3.3
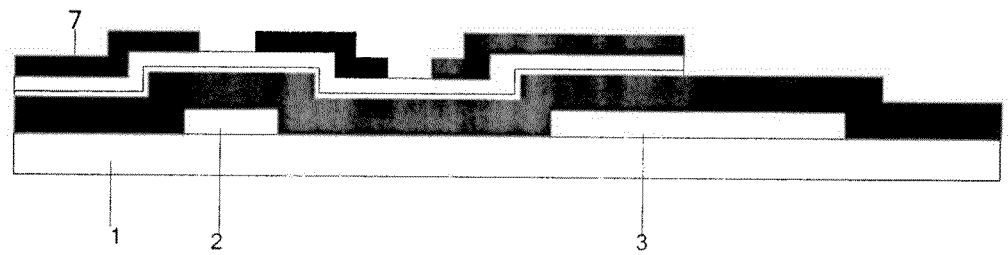
Fig. 3.4
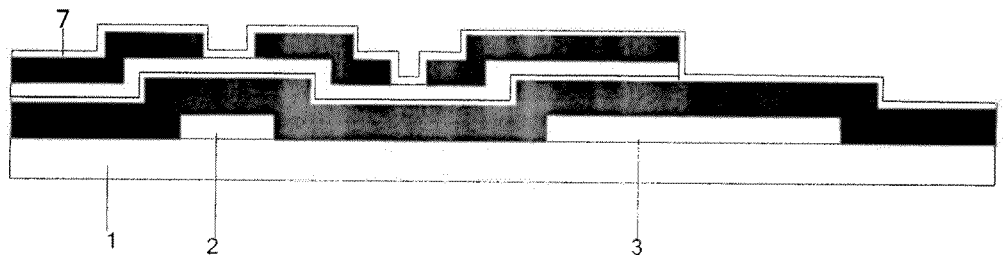
Fig. 4.1

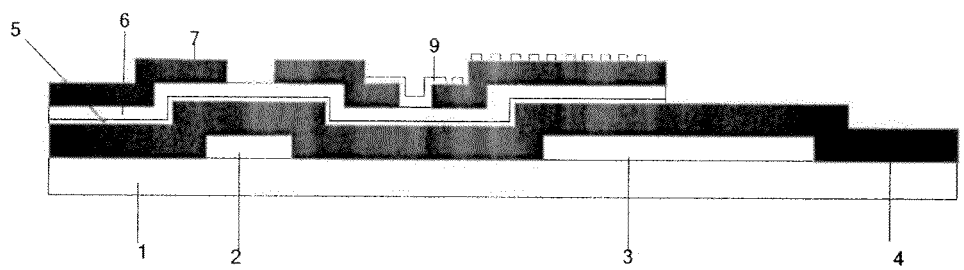
Fig. 4.2
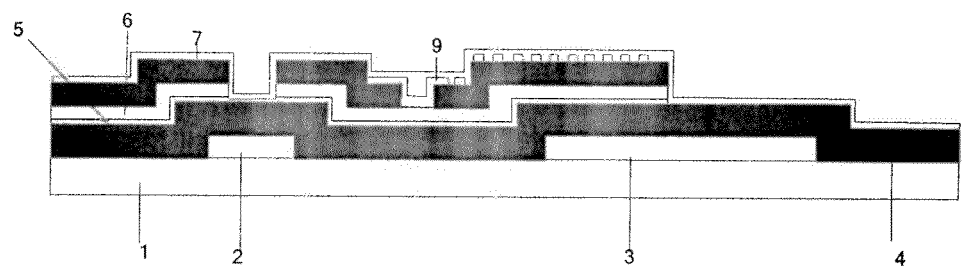
Fig. 5.1
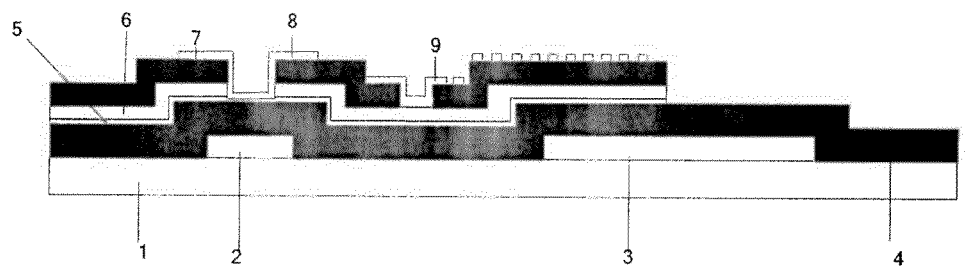
Fig. 5.2

ARRAY SUBSTRATE AND METHOD FOR FABRICATING THE SAME

CROSS REFERENCE TO RELATED APPLICATIONS

This application is based on International Application No. PCT/CN2012/084187 filed on Nov. 7, 2012, which claims priority to Chinese National Application No. 201210065761.6, filed on Mar. 13, 2012, the contents of which are incorporated herein by reference.

TECHNICAL FIELD

Embodiments of the invention relate to an array substrate and a method for fabricating the same.

BACKGROUND

Thin Film Transistor Liquid Crystal Display (TFT-LCD) is a widely-used Flat Panel Display (FPD).

With the improvement in technologies, consumers are expecting higher picture quality from mobile devices. Currently, the conventional Twisted Nematic (TW) LCD may not provide good enough picture quality as required by the market. As a result, all manufacturers are now implementing in the mobile devices various wide viewing angle techniques having better picture qualities, such as In-Plane Switching (IPS), Vertical Alignment (VA), Advanced-Super Dimensional Switching (AD-SDS, also abbreviated as ADS).

In the ADS mode, a multi-dimensional electric field is generated with both an electric field produced at edges of slit electrodes in the same plane and an electric field produced between a slit electrode layer and a plate-like electrode layer, consequently, liquid crystal molecules at all orientations, which are located directly above the electrodes and between the slit electrodes in a liquid crystal cell, can be rotated, thereby enhancing the work efficiency of liquid crystals and increasing the light transmittance. Therefore, the ADS technology can improve the picture quality of TFT-LCDs and has advantages of high transmittance, wide viewing angle, high aperture ratio, low chromatic aberration, low response time and being free of push Mura, etc.

Currently, an array substrate is obtained through forming patterns using multiple patterning processes. Each patterning process involves the processes of masking, exposing, developing, etching and removing, where the etching includes dry etching and wet etching. The number of the patterning processes may be used to evaluate the complexity of the fabrication of the TFT-LCD array substrate. In this sense, reducing the number of patterning processes is equivalent to reducing the manufacturing cost.

It may take at least four patterning processes to form an array substrate such as a bottom gate using the currently available technologies. Such processes are complicated, costly and the production cycle is relatively long. Therefore, it is needed to reduce the number of patterning processes, thereby reducing the production cycle and cost for fabricating the array substrate.

SUMMARY

For the purpose of overcoming the above-described disadvantage, embodiments of the invention provide an array substrate and its fabrication method. The method decreases the number of patterning processes while maintaining the advantages of the ADS TFT-LCD, such as having wide viewing angle and high aperture ratio, thereby reducing the production cycle and cost of the array substrate.

An aspect of the invention provides a method for fabricating an array substrate, comprising:
forming a pattern of a gate electrode and a common electrode on a substrate;
forming a pattern of a gate insulating layer, an active layer, a source/drain electrode layer and a first passivation layer, wherein the first passivation layer has a via hole and a TFT channel window, and the TFT channel window is located above the gate electrode;
forming a TFT channel and a pixel electrode with slits, wherein the pixel electrode is connected to one of the source/drain electrode through the via hole.

As an example, the method may further comprise the following step after forming the TFT channel and the pixel electrode with slits: forming a TFT channel protection layer.

In the fabrication method, for example, a material of the gate electrode and the common electrode is Single-Walled Carbon NanoTube (SWCNT).

In the fabrication method, for example, the step of forming the gate electrode and the common electrode on the substrate may comprise:
forming a first transparent conductive film on the substrate;
applying a photoresist on the first transparent conductive film, exposing and developing the photoresist using a mask plate, leaving the photoresist on the gate electrode region and the common electrode region while removing the photoresist on the rest of the region, so as to form a photoresist-completely-retained region and a photoresist-completely-removed region;
performing a first etching on the photoresist to remove the first transparent conductive film in the photoresist-completely-removed region and to form the gate electrode and the common electrode.

In the fabrication method, for example, the step of forming the pattern of the gate insulating layer, the active layer, the source/drain electrode layer and the first passivation layer may comprise:
forming the gate insulating layer film, the active layer film, the source/drain electrode metal film and the first passivation layer film sequentially;
applying a photoresist on the first passivation layer film, exposing and developing the photoresist using a gray-tone or half-tone mask plate, leaving the photoresist on the source/drain electrode region and the pixel electrode region, leaving a part of the photoresist on the TFT channel and the via hole region, while removing the photoresist on the rest of the region, so as to form a photoresist-completely-retained region, a photoresist-partly-retained region and a photoresist-completely-removed region;
etching the photoresist consecutively to etch off the first passivation layer film, the source/drain electrode metal film and the active film layer in the photoresist-completely-removed region, thereby forming the pattern of the first passivation layer, the source/drain electrode and the active layer;
performing an ashing process, and then etching the first passivation layer in the photoresist-partly-retained region to form the via hole and the TFT channel window, wherein the TFT channel window is located above the gate electrode.

In the fabrication method, for example, the step of forming the TFT channel and the pixel electrode with the slits may comprise:
forming a second transparent conductive film;
applying a photoresist on the second transparent conductive film, exposing and developing the photoresist using a mask plate, and etching the second transparent conductive film, thereby obtaining the pattern of the pixel electrode with slits, wherein the pixel electrode is connected to one of the source/drain electrode through the via hole;

etching the source/drain electrode layer and the active layer to form the TFT channel.

In the fabrication method, for example, the step of forming the TFT channel protection layer may comprise:

forming a second passivation layer;

forming the pattern of the TFT channel protection layer over the TFT channel after exposure, developing and etching.

Another aspect of the invention provides an array substrate comprising: a substrate; a gate electrode and a common electrode formed on the substrate; a gate insulating layer overlaying the substrate, the gate electrode and the common electrode; an active layer formed on the gate insulating layer; a source/drain electrode formed on the active layer and separated by a TFT channel being above the gate electrode; a first passivation layer with a via hole formed on the source/drain electrode layer; a pixel electrode with slits on the first passivation layer, wherein the pixel electrode is connected to one of the source/drain electrode through the via hole.

For example, the array substrate may further comprise a second passivation layer overlaying the TFT channel.

In the array substrate, for example, a material of the gate electrode and the common electrode may be Single-Walled Carbon NanoTube (SWCNT).

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 1 schematically illustrates a configuration of an array substrate in accordance with Embodiment 1 of the invention;

FIGS. 2.1 to 2.3 schematically illustrates the processes for forming a gate electrode, a gate line and a common electrode on the array substrate using a method for fabricating the substrate in accordance with Embodiment 1 of the invention;

FIGS. 3.1 to 3.4 schematically illustrates the processes for forming a pattern of a first passivation layer, a source/drain electrode as well as a data line layer and an active layer using a method for fabricating the array substrate in accordance with Embodiment 1 of the invention;

FIGS. 4.1 and 4.2 schematically illustrates the processes for forming a TFT channel and a pixel electrode with slits using a method for fabricating the array substrate in accordance with Embodiment 1 of the invention; and FIGS. 5.1 and 5.2 schematically illustrates the process for forming a TFT channel protection layer using a method for fabricating the array substrate in accordance with Embodiment 2 of the invention.

DESCRIPTION OF THE REFERENCE NUMERALS

1: substrate 2: gate electrode 3: common electrode 4: insulating layer 5: active layer 6: source/drain electrode 7: first passivation layer 8: second passivation layer 9: pixel electrode 10: photoresist

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at lease one. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The array substrate in accordance with the embodiment of the invention comprises a plurality of gate lines and a plurality of data lines intersecting with each other to define pixel cells arranged in matrix. Each pixel cell comprises a TFT functioning as a switching device, a pixel electrode for controlling the arrangement of liquid crystals and a common electrode. The gate, the source and the drain of the TFT are electrically connected to or integrally formed with the corresponding gate line, the data line and the pixel electrode respectively. The following description is directed to a single or a plurality of pixel(s), though other pixels may be formed in the same way.

Embodiment 1

As illustrated in FIG. 1, the array substrate of the embodiment comprises: a substrate 1 made of quartz glass, glass or plastic; a gate line (not shown), a gate electrode 2 and a plate-like common electrode 3 formed on the substrate 1, where the material of the gate electrode, the gate line and the plate-like common electrode 3 may be Single-Walled Carbon NanoTube (SWCNT); a gate insulating layer 4 overlaying the substrate 1, the gate electrode 2, the gate line and the plate-like common electrode 3, where the material for the gate insulating layer 4 may be silicon nitrides (SiNx), aluminum nitrides (AlN) or aluminum oxides (Al2O3) etc; an active layer 5 formed on the gate insulating layer 4, the material of which may be amorphous silicon (a-Si) with a thickness of 100 nm to 150 nm; a data line and a source/drain electrode 6 separated by a TFT channel (i.e., the channel is located between two opposing source/drain electrode 6 (a source electrode and a drain electrode)) formed on the active layer 5, where the TFT channel is above the gate electrode 2; a first passivation layer 7 having a via hole formed on the source/drain electrode 6 and the data line; a pixel electrode 9 with slits formed on the first passivation layer 7, where the pixel electrode 9 with slits is connected to one of the source/drain electrode 6 through the via hole, and the other source/drain electrode 6 is integrally formed with the data line. The plate-like common electrode 3 is partially overlapped with the pixel electrode 9 with slits to form a multi-dimensional electric field under an external voltage.

As an example, the region of the plate-like common electrode 3 preferably overlays the region of the pixel electrode 9 with slits such that liquid crystal molecules at all orientations, which are located between the slits of the pixel electrodes 9 and directly above the plate-like common electrode 3, may be rotated, thereby enhancing the work efficiency of liquid crystals and increasing the light transmittance.

As another example, the common electrode 3 may further have slits preferably, which further facilitates generating multi-dimensional electric fields between the common electrode 3 and the pixel electrode 9 with slits under the external voltage, thereby enhancing the work efficiency of liquid crystals and increasing the light transmittance.

Embodiment 2

As shown in FIG. 5.2, Embodiment 2 is generally the same as Embodiment 1 except that the array substrate further comprises a second passivation layer 8 overlaying the TFT channel. The second passivation layer 8 is also known as the channel protection layer, which is used to protect the TFT channel and to improve the stability of the TFT.

Embodiment 3

Embodiment 3 is generally the same as Embodiment 2 except that the material of the active layer 5 may be indium gallium zinc oxides (IGZO), zinc oxides (ZnO), indium zinc oxides (IZO), indium oxides (In2O3) or the like with a thickness of 100 nm to 150 nm.

Embodiment 4

The embodiment provides a method for fabricating the array substrate described above. The method comprises the following patterning process, which will be described briefly.

First Patterning Process

The first patterning process is used to form the gate electrode, the gate line and the plate-like common electrode on the substrate.

The material of the gate electrode, the gate line and the plate-like common electrode may be SWCNT as an example.

In this step, a common electrode with slits may also be formed on the substrate as required, which may further facilitate generating multi-dimensional electric fields between the common electrode and the pixel electrode 9 with slits under the external voltage, thereby enhancing the work efficiency of liquid crystals and increasing the light transmittance.

A detailed example comprises the following steps.

As shown in FIG. 2.1, a first transparent conductive film made of SWCNT with a thickness of 100 nm to 300 nm, preferably 200 nm, is deposited on the substrate 1 using a conveying roller or a roll-to-roll process. The material of the first transparent conductive film may be SWCNT available on the market as an example.

A photoresist layer 10 is applied on the first transparent conductive film and exposed using a regular mask plate. The exposed photoresist is developed to keep the photoresist on the gate line region (not shown), the gate electrode region and the plate-like common electrode region while removing the photoresist on the rest of the region, thereby obtaining the pattern as shown in FIG. 2.2, which comprises a photoresist-completely-removed region and a photoresist-completely-retained region. In FIG. 2.2, WP indicates the photoresist-completely-removed region and NP indicates the photoresist-completely-retained region.

A first etching is performed by using the pattern of the resultant photoresist 10 to etch off the first transparent conductive film in the photoresist-completely-removed region and thus forming the gate electrode 2, the gate line (not shown) and the plate-like common electrode 3 as shown in FIG. 2.3.

Second Patterning Process

A second patterning process is used to form the pattern of the gate insulating layer, the active layer, the source/drain electrode layer and the first passivation layer. The first passivation layer has a via hole and a TFT channel window located above the gate electrode.

A detailed example comprises the following steps.

As shown in FIG. 3.1, a gate insulating layer film of 300 nm to 500 nm, preferably 400 nm, is deposited using Plasma Enhanced Chemical Vapor Deposition (PECVD). The material of the film may be SiNx, SiOx or the like. Alternatively, a gate insulating layer film of 300 nm to 500 nm, preferably 400 nm, is deposited through physical sputtering. The material of the film may be Al2O3 or the like.

A film of a-Si with a thickness of 100 nm to 150 nm for the active layer is deposited using PECVD. Next, a metal film for the source/drain electrode of 200 nm to 400 nm, preferably 300 nm, is deposited with magnetron sputtering. The material of the source/drain electrode may be Copper (Cu), Aluminum (Al), Molybdenum (Mo), Titanium (Ti) or the like. Finally, a film for the first passivation layer of 200 nm to 400 nm, preferably 300 nm, is deposited using PECVD and the material of which may be SiNx.

A layer of photoresist 10 is applied on the first passivation layer in the stack and exposed using a gray-tone or half-tone mask plate. After that, the exposed photoresist is developed to keep the photoresist on the source/drain electrode region, the data line region (not shown) and the pixel electrode region, to keep a part of the photoresist on the TFT channel and the via hole region, and to remove the photoresist on the rest of the region, thereby obtaining the pattern as shown in FIG. 3.2, which comprises a photoresist-completely-removed region, a photoresist-partly-retained region and a photoresist-completely-retained region. In FIG. 3.2, WP indicates the photoresist-completely-removed region and NP indicates the photoresist-completely-retained region and HP indicates the photoresist-partly-retained region.

Etching is consecutively performed using the pattern of the photoresist to etch off the first passivation layer film, the source/drain electrode metal film and the active layer film respectively, thereby obtaining the pattern of the first passivation layer, the source/drain electrode layer, the data line (not shown) and the active layer as shown in FIG. 3.3.

Then, the aching process is performed so as to remove the photoresist in the photoresist-partly-retained region and to thin the photoresist in the photoresist-completely-retained region. The first passivation layer 7 in the photoresist-partly-retained region is etched to form the via hole and the TFT channel window as shown in FIG. 3.4, and the TFT channel window is above the gate electrode.

Third Patterning Process

A third patterning process is used to form the TFT channel and the pixel electrode with slits. The pixel electrode with slits is connected with one of the source/drain electrode through the via hole. The pixel electrode with slits is partly overlapped with the plate-like common electrode to form multi-dimensional electric fields.

As an example, the region of the plate-like common electrode preferably overlays the region of the pixel electrode with slits such that liquid crystal molecules at all orientations, which are located between the slits of the pixel electrodes and directly above the plate-like common electrode, may be rotated, thereby enhancing the work efficiency of liquid crystals and increasing the light transmittance.

A detailed example comprises the following steps.

As shown in FIG. 4.1, a second transparent conductive film made of SWCNT with a thickness of about 100 nm to 300 nm, preferably 200 nm, is deposited on the substrate 1 using the roll to roll process. The material of the second transparent conductive film may be SWCNT available on the market as an example.

A photoresist layer is applied on the second transparent conductive film and exposed, developed and etched using a mask plate, thereby obtaining the pattern of the pixel electrode 9 with slits as shown in FIG. 4.2. The pixel electrode is connected to one of the source/drain electrode through the via hole.

The source/drain electrode and the date line layer as well as the active layer are etched to form the TFT channel, thereby obtaining the pattern as shown in FIG. 1. The pixel electrode with slits and the plate-like common electrode are partly overlapped to generate multi-dimensional electric fields under the external voltage.

In the embodiment described above, three patterning processes are used to fabricate the array substrate. Such fabrication method is simple and stable, which reduces not only the production cycle but also the cost. Moreover, the use of the ADS mode improves the performance of the TFT-LCT. The light transmittance and flexibility of the TFT-LCD are both improved by using SWCNT as the transparent conductive layer.

Embodiment 5

Embodiment 5 is generally the same as Embodiment 4 except the method further comprises the following step after forming the TFT channel and pixel electrode with the slits:

The TFT channel protection layer is formed using a fourth patterning process.

A detailed example comprises the following steps.

A second passivation layer made of SiO2 or SiNx with a thickness of 300 nm to 500 nm, preferably 400 nm, is deposited using PECVD, thereby obtaining the pattern as shown in FIG. 5.1.

The pattern of the TFT channel protection layer as shown in FIG. 5.2 is formed above the TFT channel after the processes of exposure, developing and etching.

As a result, it provides better protection for the TFT channel and improves the stability of the TFT.

Embodiment 6

Embodiment 6 is generally the same as Embodiment 5 except that the active to layer film of 100 nm to 150 nm is deposited using magnetron sputtering. The material of the active layer may be ZnO, In2O3, IZO. IGZO or the like.

That is to say, the fabrication method according to the embodiment of the invention may be used to fabricate not only a-Si TFT-LCT array substrate but also oxide TFT-LCT array substrate.

In summary, the embodiments of the invention disclose an array substrate and its fabrication method. The method is simple and stable when used to fabricate the array substrate, which not only shortens the production cycle but also reduces the cost. Moreover, the use of the ADS mode improves the performance of the TFT-LCT. The light transmittance and flexibility of the TFT-LCD are both improved by using SWCNT as the transparent conductive layer.

What are described above is related to the illustrative embodiments of the disclosure only and not limitative to the scope of the disclosure; the scopes of the disclosure are defined by the accompanying claims.

The invention claimed is:

1. A method for fabricating an array substrate, comprising:
   forming a pattern of a gate electrode and a common electrode on a substrate;
   forming a pattern of a gate insulating layer, an active layer, a source/drain electrode layer and a first passivation layer, wherein the first passivation layer has a via hole and a TFT channel window, and the TFT channel window is located above the gate electrode;
   forming a TFT channel and a pixel electrode with slits, wherein the pixel electrode is connected to one of the source/drain electrode through the via hole;
   wherein a material of the gate electrode and the common electrode is single-walled carbon nanotube.

2. The method of claim 1, further comprises the following step after forming the TFT channel and the pixel electrode with slits:
   forming a TFT channel protection layer.

3. The method of claim 1, wherein the step of forming the gate electrode and the common electrode on the substrate comprises:
   forming a first transparent conductive film on the substrate;
   applying a photoresist on the first transparent conductive film, exposing and developing the photoresist using a mask plate, leaving the photoresist on the gate electrode region and the common electrode region while removing the photoresist on the rest of the region, so as to form a photoresist-completely-retained region and a photoresist-completely-removed region;
   performing a first etching on the photoresist to remove the first transparent conductive film in the photoresist-completely-removed region and to form the gate electrode and the common electrode.

4. The method of claim 1, wherein the step of forming the pattern of the gate insulating layer, the active layer, the source/drain electrode layer and the first passivation layer comprises:
   forming the gate insulating layer film, the active layer film, the source/drain electrode metal film and the first passivation layer film sequentially;
   applying a photoresist on the first passivation layer film, exposing and developing the photoresist using a graytone or half-tone mask plate, leaving the photoresist on the source/drain electrode region and the pixel electrode region, leaving a part of the photoresist on the TFT channel and the via hole region, while removing the photoresist on the rest of the region, so as to form a photoresist-completely-retained region, a photoresist-partly-retained region and a photoresist-completely-removed region;
   etching the photoresist consecutively to etch off the first passivation layer film, the source/drain electrode metal film and the active film layer in the photoresist-completely-removed region, thereby forming the pattern of the first passivation layer, the source/drain electrode and the active layer;
   performing an ashing process, and then etching the first passivation layer in the photoresist-partly-retained region to form the via hole and the TFT channel window, wherein the TFT channel window is located above the gate electrode.

5. The method of claim 1, wherein the step of forming the TFT channel and the pixel electrode with the slits comprises:
   forming a second transparent conductive film;
   applying a photoresist on the second transparent conductive film, exposing and developing the photoresist using a mask plate, and etching the second transparent conductive film, thereby obtaining the pattern of the pixel electrode with slits, wherein the pixel electrode is connected to one of the source/drain electrode through the via hole;

etching the source/drain electrode layer and the active layer to form the TFT channel.

6. The method of claim 2, wherein forming the TFT channel protection layer comprises:

forming a second passivation layer;

forming the pattern of the TFT channel protection layer over the TFT channel after exposure, developing and etching.

7. An array substrate comprising: a substrate; a gate electrode and a common electrode formed on the substrate; a gate insulating layer overlaying the substrate, the gate electrode and the common electrode; an active layer formed on the gate insulating layer; a source/drain electrode formed on the active layer and separated by a TFT channel being above the gate electrode; a first passivation layer with a via hole formed on the source/drain electrode layer; a pixel electrode with slits on the first passivation layer, wherein the pixel electrode is connected to one of the source/drain electrode through the via hole and a material of the gate electrode and the common electrode is single-walled carbon nanotube.

8. The array substrate of claim 7, further comprises a second passivation layer overlaying the TFT channel.

* * * * *